United States Patent
Hubert et al.

[19]

[11] Patent Number: 5,820,678
[45] Date of Patent: Oct. 13, 1998

[54] SOLID SOURCE MOCVD SYSTEM

[75] Inventors: Brian N. Hubert, Yakima, Wash.; Xin Di Wu, San Jose, Calif.

[73] Assignee: The Regents of the University of California, Los Alamos, N. Mex.

[21] Appl. No.: 865,827

[22] Filed: May 30, 1997

[51] Int. Cl.[6] .................................................. C23C 16/00
[52] U.S. Cl. ...................... 118/690; 118/689; 118/708; 118/712; 118/725; 118/726
[58] Field of Search .................................... 118/726, 689, 118/690, 708, 712, 725

[56] References Cited

U.S. PATENT DOCUMENTS

| | | | |
|---|---|---|---|
| 5,447,569 | 9/1995 | Hiskes | 118/726 |
| 5,476,547 | 12/1995 | Mikoshiba | 118/726 |
| 5,553,395 | 9/1996 | Wen | 118/726 |

*Primary Examiner*—Richard Bueker
*Attorney, Agent, or Firm*—Bruce H. Cottrell

[57] ABSTRACT

A system for MOCVD fabrication of superconducting and non-superconducting oxide films provides a delivery system for the feeding of metalorganic precursors for multi-component chemical vapor deposition. The delivery system can include multiple cartridges containing tightly packed precursor materials. The contents of each cartridge can be ground at a desired rate and fed together with precursor materials from other cartridges to a vaporization zone and then to a reaction zone within a deposition chamber for thin film deposition.

21 Claims, 6 Drawing Sheets

SOLID SOURCE MOCVD SYSTEM

This invention was made with government support under Contract No. W-7405-ENG-36 awarded by the U.S. Department of Energy. The government has certain rights in the invention.

FIELD OF THE INVENTION

The present invention relates to a solid-source chemical vapor deposition system useful in techniques for fabricating thin films of multicomponent oxide materials, such as, e.g., high temperature superconducting oxide thin films, by metalorganic chemical vapor deposition (MOCVD).

BACKGROUND OF THE INVENTION

The discovery of superconducting oxide materials with critical temperatures above the boiling point of liquid nitrogen has stimulated much interest in methods for making thin films of these materials. Such films can be extremely useful in electronic devices and energy transport systems, and many researchers have devoted substantial effort to finding a satisfactory method of fabricating these films.

Chemical vapor deposition has been extensively used for preparation of films and coatings in a variety of applications. The advantages of chemical vapor deposition include higher quality, faster processing and the ability to coat substrates of irregular shapes. Accordingly, much work has been focused on attempts to fabricate superconducting oxide films by chemical vapor deposition in a feasible manner. In particular, much attention has been devoted to the growth of thin films of superconductive materials, e.g., $YBa_2Cu_3O_{7-x}$ (YBCO) material, by MOCVD. Such thin films were first fabricated in 1988, soon after the discovery of the superconducting properties of YBCO.

The primary difficulty with such a MOCVD process arises from the solid precursor reagents that are used as the source materials. These metalorganic precursors have typically been tetramethylheptanedionate (TMHD) powders that are chelates of the yttrium, barium, and copper source metals. These precursors tend to decompose at temperatures close to the vaporization temperatures. This is particularly true of the barium-TMHD precursor, which decomposes almost as fast as it vaporizes. Thus, the quantity and volatility of the source materials change continuously and non-reproducibly. Therefore, it is important to control precisely the exposure of these precursors to elevated temperatures. Ideally this exposure should be as short as possible. Yet the chemical vapor deposition process requires that the precursor sources be stabilized at the vaporization temperatures, which means that this exposure may extend over a substantial period of time. High quality YBCO films have been fabricated, despite these obstacles, but low deposition rates are reported, typically 1 micron per hour ($\mu$m/h). In addition, the control of the deposition process is very delicate, repeatability is poor, and previous processes have not attained commercial feasibility.

The main disadvantage of MOCVD of YBCO stems from the difficulty of reproducibly transporting the metalorganic precursor materials to the substrate for deposition. Nearly all YBCO deposition systems that have been developed to date differ from one another primarily by their methods of precursor material delivery. Naturally, there are a host of other factors that have determined the relative success or failure of any of these systems, but many researchers have come to recognize that optimal precursor material delivery is the key to successful YBCO superconductor formation.

MOCVD processes presently utilize one of about four types of precursor delivery techniques: (1) liquid-source delivery with or without aerosol assistance and plasma enhancement; (2) bubbler delivery with or without carrier gas; (3) free-flowing powder delivery; and, (4) solid-source delivery.

One present bubbler delivery MOCVD process employs precursor sources in separate vaporization chambers. The precursors, which may be solid or liquid, are placed into boats or bubblers, and individually heated to temperatures at which they develop appreciable vapor pressures. The vaporized precursor materials are then transported to a reaction chamber by passing a carrier gas over the boats or bubblers, and sweeping the various vapors to the reaction chamber where they are mixed and a reaction product is deposited on a heated substrate. This technique works well for liquid precursors, where the carrier gas can be bubbled up through the liquid reservoir to fully saturate it. In this way, the amount of material transported to the reaction chamber is precisely controlled by the temperature of the precursor reservoir (which must be in thermal equilibrium) and by the flow rate of the carrier gas bubbled through the reservoir. Elaborate schemes have been developed to ensure complete saturation, precise temperature control, and accurate gas flow regulation. When this method is used to grow heterostructure films with sharp boundaries between layers, the pressures of the various gas streams must be balanced to avoid composition excursions when the composition is changed. One drawback is that this system relies on vaporization of precursor materials to initiate mass flow to downstream processes.

This technique encounters further problems when it is used for solid precursors. It is difficult to ensure complete saturation of the carrier gas stream at the elevated temperatures required to raise the solid vapor pressure to appreciable values because the surface area of the solid is changing continuously due to depletion and grain growth effects. This problem may be alleviated by using large excesses of precursor material beyond the amount needed for film growth. This can result in a substantial waste of precursor materials.

The use of a conventional bubbler delivery MOCVD method for making superconducting oxide films is discussed in the article "Preparation of Superconducting-Oxide Films by CVD and Their Properties" by H. Yamane et al., published in Journal de Physique, Colloque C5, Supplement au n° 5, Tome 50, Mai 1989. This paper describes the parameter control required to grow these films and the resulting properties of films made in this way. The various problems of the process are discussed.

The decomposition problem is also addressed by W. J. Lackey et al. in "Rapid Chemical Vapor Deposition of Superconducting $YBa_2Cu_3O_x$", Applied Physics Letters, vol. 56, no. 12, 19 Mar., 1990, pages 1175–1177. A powder feed method is described for introducing mixtures of finely ground precursor reagents into the carrier gas, which itself is a mixture of argon and oxygen. The powder is transported to the reaction zone where it vaporizes, reacts, and deposits $YBa_2Cu_3O_x$ on a hot substrate. This method achieves substantially higher deposition rates (from about 200 to 240 $\mu$m/h) and improved film quality control in comparison with the conventional bubbler delivery method. Improvements with respect to the process control problem are also reported.

Yet, drawbacks to this process remain. For example, powders are generally difficult to handle and cannot be dispersed in a dependable and continuous particle by particle manner into a gas stream. Also, some powder materials tend to agglomerate into larger particles, and delivery lines and chambers can be coated with finely divided particles.

A deposition system for forming superconducting thin films by solid-source MOCVD is also described in U.S. Pat. No. 5,447,569 by Hiskes et al. wherein a single precursor reagent source, i.e., a mixture of metal chelates in powdered form, is packed into a glass tube having a longitudinal slot running the length of the tube. The powder mixture composition is determined by the desired stoichiometric ratios of the deposited film. The tube is longitudinally moved at a controlled rate through a high temperature region defined by a sharp temperature gradient, such that the powder mixture passing into this region vaporizes at a steady state and escapes from the tube through the slot. The vaporized precursor mixture is transported by a carrier gas to the substrate where the reaction and deposition takes place. Oxygen is introduced into the mixture at a controlled rate, and the reaction zone is heated to promote the chemical reaction. The reaction may be enhanced further by surrounding the zone with coils driven by an ac generator to produce an rf plasma in the mixture. This apparatus and method have been used to grow high quality superconducting oxide films where the film growth rate and composition can be independently controlled.

Yet, in the process of Hiskes et al. deposition rates are generally rather slow, ranging from about 0.3 to about 0.8 $\mu$m/h, and continuous-process runs cannot be supported. Additionally, composition of the final deposited film is controlled only by the pre-mixture of species packed into the glass tube or cartridge. Finally, this system relies on vaporization of precursor materials to initiate mass flow to downstream processes.

It is an object of this invention to provide an apparatus and method for fabricating multicomponent oxide thin films such as superconducting oxide thin films by the MOCVD process using a precursor material delivery system capable of dispensing small amounts of source materials at precisely controlled rates over long periods of time.

Another object of this invention is to provide an apparatus and method including real-time control over composition.

Still another object of this invention is to provide an apparatus and method including real-time control over composition in which the decomposition of the precursor reagents prior to arrival in the reaction zone is minimized.

A further object of this invention is to provide an apparatus and method for fabricating superconducting oxide thin films by the MOCVD process in which the total surface area of source materials is maximized to increase volatility and deposition rates.

Yet another object of this invention is to provide an apparatus and method for fabricating superconducting oxide thin films by the MOCVD process in which the source materials are kept in the solid phase until just prior to vaporization.

SUMMARY OF THE INVENTION

To achieve the foregoing and other objects, and in accordance with the purposes of the present invention, as embodied and broadly described herein, the present invention provides an improved apparatus and method for fabricating metal oxide thin films, e.g., superconducting metal oxide thin films, with the MOCVD process. The apparatus includes a delivery means for feeding a solid including at least one precursor material into a cutting means for generating small diameter particles of said solid, a vaporizing means for raising the temperature of said small diameter particles above their vaporization temperatures whereby vapors of said small diameter particles are generated, a reaction zone wherein said vapors undergo chemical reaction and deposit on a substrate within said reaction zone, and, a transport means for transporting said small diameter particles from said cutting means to said vaporizing means and for transporting said vapors of said small diameter particles from said vaporizing means to said reaction zone.

DETAILED DESCRIPTION

The present invention is concerned with an apparatus and method for MOCVD processing of multicomponent oxide materials. By "multicomponent oxide materials" is meant oxide materials including more than one metal component such as found in high temperature superconductor compositions such as YBCO, electro-optical materials such as $LiNbO_3$, $KNbO_3$, $Sr_xBa_{1-x}Nb_2O_6$, and the like.

In an embodiment of the present invention for the MOCVD processing of thin films of YBCO, precursor powders of yttrium, barium and copper beta-diketonates are used as sources for the metallic ions. Initially, the precursor powders are packed into hollow stainless steel cartridges using a hand press at pressures of about 8000 pounds per square inch (psi) to about 12,000 psi whereby the free-flowing powders are transformed into packed solids with the basic consistency of chalk.

Packed cartridges including the precursor powders are loaded into the top of a delivery/feeder device. A bottommost cartridge in the vertical stacking of the cartridges is positioned for processing. The packed precursor powder within a cartridge is slowly pushed from inside of the cartridge into a high speed grinding mechanism whereby submicron powder particles can be generated. The powder particles are then swept downstream by a carrier gas or mixture of carrier gases into a vaporizer chamber whereat the powder particles are relatively instantly sublimed. After sublimation the carrier gas or gases carry the sublimed vapors of precursor materials into a deposition chamber situated in close proximity to the vaporizer for contact with a target substrate.

Figure 1:
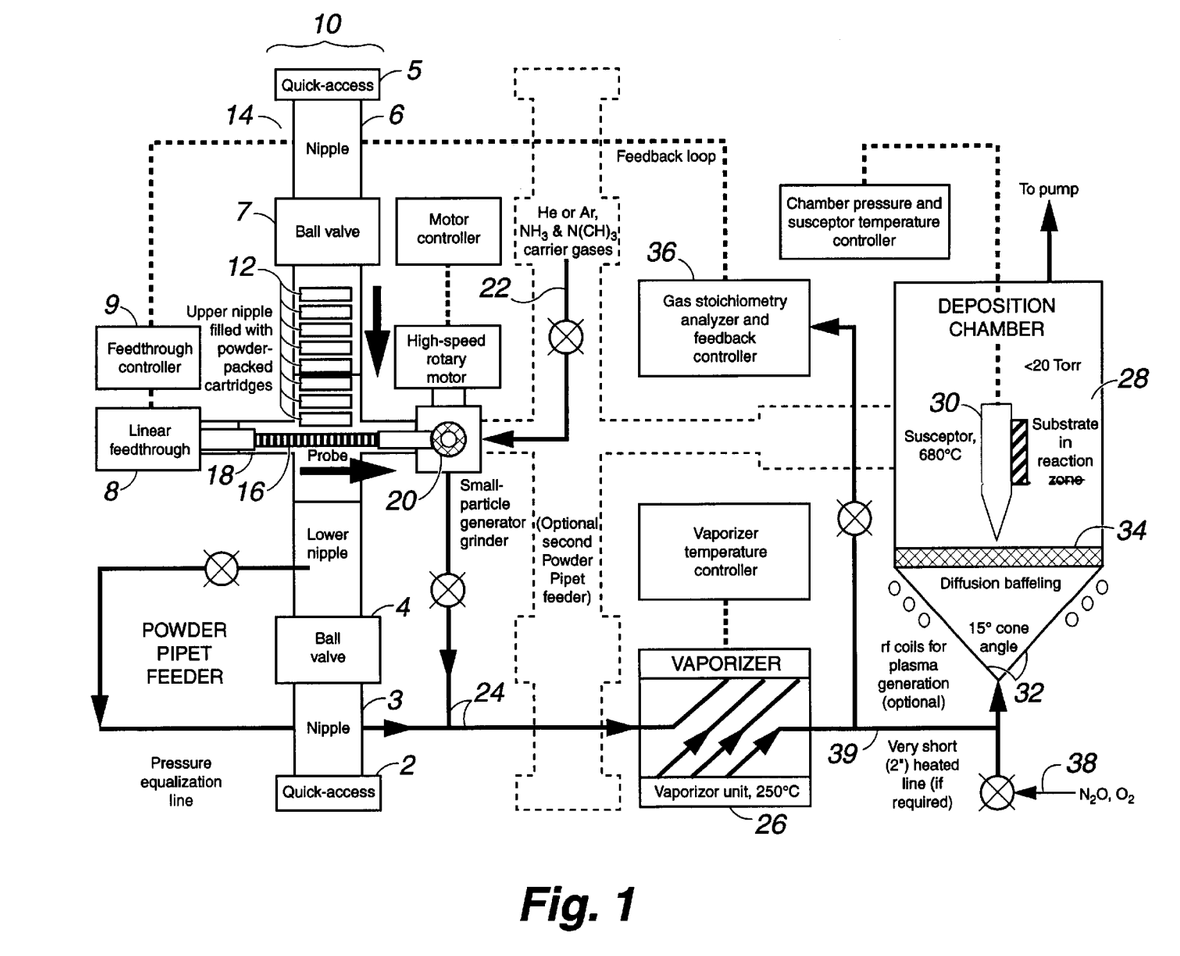
FIG. 1 is a schematic diagram of the MOCVD apparatus of the invention, viewed in the horizontal direction.

Referring now to FIG. 1, the MOCVD reactor apparatus 10 includes a stack of packed cartridges 12 within a vertical arm 14 of apparatus 10. The linear feedthrough rod 16 is situated within a horizontal arm 18 of apparatus 10 and rod 16 can be moved horizontally at a controlled rate. Rod 16 serves to push the packed precursor powder within bottommost packed cartridge 12 into grinding mechanism 20. Carrier gas source 22 provides the carrier gas or gases to carry powder particles resulting from grinding of packed precursor powder through line 24 into a vaporizer chamber 26. As the particles are not subjected to any potential thermal degradation until arriving at the vaporizer, the line 24 can be of any arbitrary length. From vaporizer chamber 26, carrier gas or gases carry the precursor vapors through a short transport line 39 and into a reaction zone within deposition chamber 28 including a substrate holder and heater 30. Preferably, this transport line is as short as possible to minimize the length of time between vaporization and deposition. Additionally, transport line 39 may be wrapped with heating tape to keep the walls at a desired uniform temperature of, e.g., about 250° C. to 300° C. to prevent condensation of metalorganic vapors. Preferably, deposition chamber 28 includes outwardly tapered sides 32 and diffusion baffling 34 to aid in providing the preferred laminar flow of precursor vapors and carrier gas or gases. Also shown is an optional gas stoichiometry analyzer 36, such gas stoichiometry analyzer 36 linked as a feedback controller to linear feedthrough rod 16. The drive mechanism for linear feedthrough rod 16 can be a precision linear feedthrough stepper motor and ballscrew configuration 8 controlled by feedthrough controller 9. In this way the horizontal position and movement of bottom-most packed cartridge 12 and the packed precursor powder within bottom-most packed cartridge 12 is controlled.

Figure 2A:
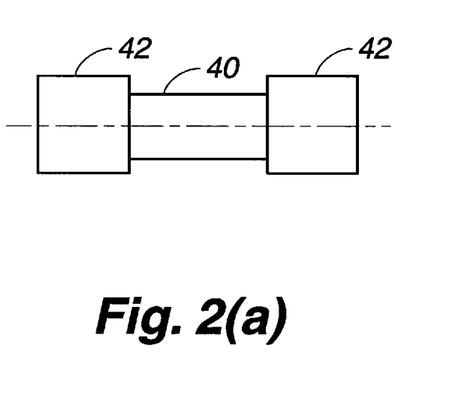
FIGS. 2(a) and 2(b) show views of a powder-pack cartridge of the present invention.
Figure 2B:
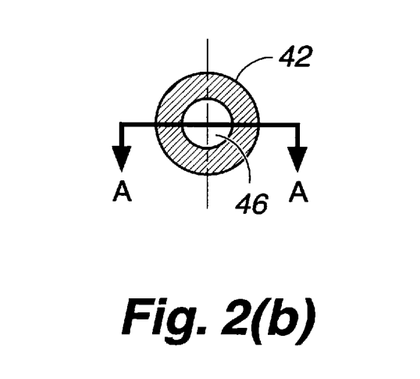

Referring to FIGS. 2(a) and 2(b), the configuration of a cartridge 12 used in the apparatus of the present invention is shown. FIG. 2(a) shows a side view of cartridge 12, while FIG. 2(b) shows an end view of cartridge 12. In FIG. 2(a) is seen an indented central portion 40 and protruding end portions 42. In FIG. 2(b) is seen an end view of protruding end portion 42 and aperture or core 46 which can contain pressed precursor powder having the proper composition to yield the desired stoichiometry of the deposited film. For the case of YBCO films the precursor powders may be chelates of yttrium, barium and copper. The powders can be thoroughly mixed, dried, and packed under pressure into the packed cartridge 12. If more than one MOCVD apparatus is used, individual precursor powders can be separately located within different packed cartridges which can then be independently controlled and ground.

Still referring to FIG. 1, oxygen is introduced into the vapor mixture through the intake tube and valve 38 at a flow rate which may vary from about 100 to about 1000 cm³/minute. The gases flow upward through an outwardly tapered section with sloped walls 32 and diffusion baffling 34 to enhance further mixing and laminar flow.

Additionally, coils connected to a 13.54 MHz generator may be wrapped around outwardly tapered section 32 to produce an rf plasma and enhance the chemical reactions as the gas mixture arrives at the reaction zone within the deposition chamber.

A target substrate is attached, e.g., with thermally conductive paste, to a substrate holder and heater 30 inside the deposition chamber, heated by a susceptor. The substrate holder and heater 30 and an attached substrate are typically maintained at the necessary temperatures, generally temperatures of from about 750° C. to about 800° C. for YBCO deposition, which can be measured by a thermocouple. Continuous depositions onto moving, elongated substrates are possible if substrate holder 30 is replaced by an outlay reel and a takeup reel, with substrate material held in tension between them as they rotate, such reels not shown.

The upper end of the deposition chamber is sealed through which an exhaust tube extends. The exhaust tube leads to a vacuum pump, which maintains the interior of the deposition chamber at a reduced pressure during deposition of generally less than about 20 Torr. This pressure can be regulated by a manometer, not shown.

Figure 3:
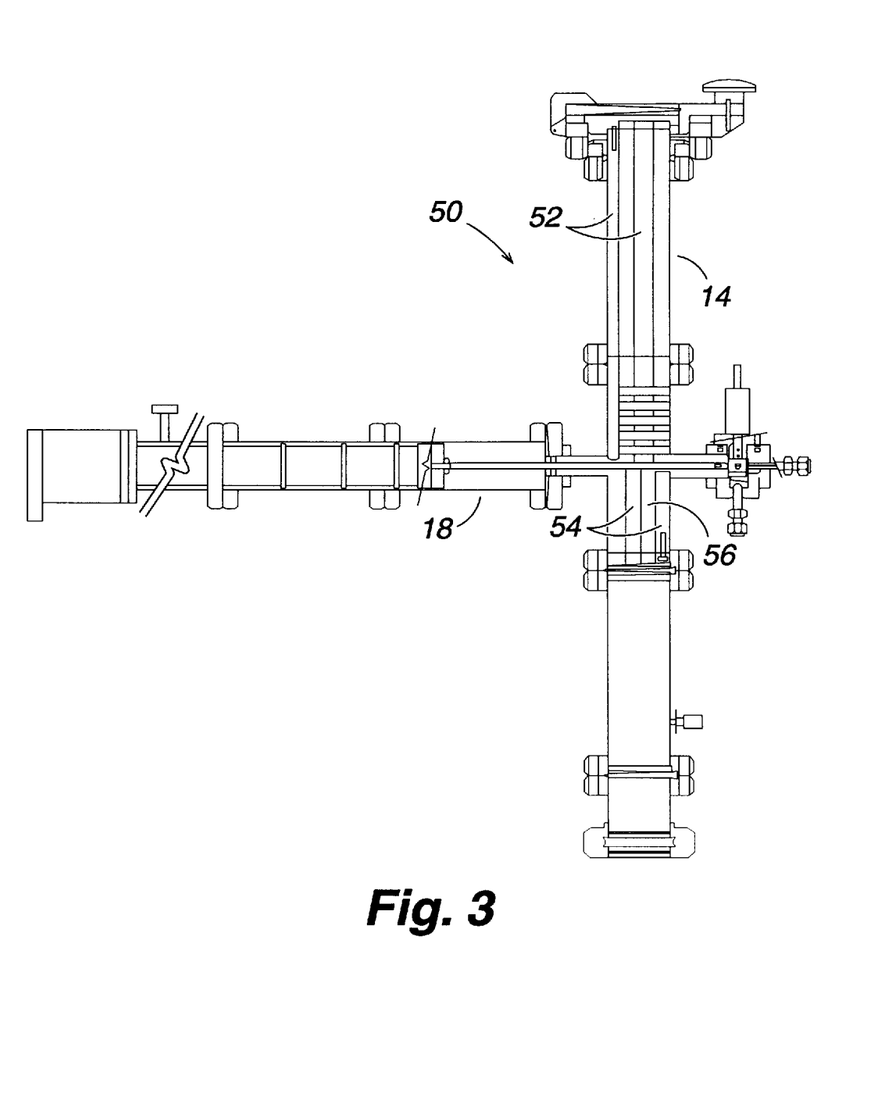
FIG. 3 is a vertical cross-section of a delivery/feeder device in an extended mode.

Referring to FIG. 3, a vertical cross-section of a delivery/feeder device 50 is shown. Vertical arm 14 within delivery/feeder device 50 includes upper guide tracks 52 and lower guide tracks 54. The upper portion of vertical arm 14 (above the intersection of vertical and horizontal arms, such intersection referred to as the reducing cross) serves as a magazine for the loading and storage of packed cartridges 12 and the protruding end portions 42 align within upper guide tracks 52. The shape of the guide tracks closely conforms to the end portions of the packed cartridges thereby preventing the cartridges from moving out of position. Within vertical arm 14 is a structure 56 providing a supporting ledge that precisely positions the bottom-most packed cartridge 12 for processing. Structure 56 is situated at the intersection of the vertical arm 14 and horizontal arm 18 with the position fixed by an anchor plate attached, e.g., by welding, to the inner walls of the arms. The lower portion of vertical arm 14 (below the intersection of vertical and horizontal arms) serves as a temporary waste receptacle for empty cartridges that have been previously processed. The vertical arm 14 can also provide facilities for the removal of empty cartridges from the apparatus and the loading of packed cartridges into the apparatus without breaking of the vacuum. This would allow nearly continuous feeding of precursor materials to the remainder of the MOCVD apparatus for long durations without interruption. Referring again to FIG. 1, for example, a quick-access door 5, nipple section 6 with guide tracks, and a clear bore ball valve 7 attached to the upper portion of vertical arm 14 would allow replenishment of the supply of packed cartridges without the loss of vacuum.

A typical reloading procedure could involve closing of the ball valve, increasing the nipple pressure to 1 atmosphere (atm), opening the quick-access door at the top of the vertical arm, filling the nipple section with a load of packed cartridges, closing the quick-access door, pumping the nipple down to vacuum conditions, and finally opening the ball valve to allow the packed cartridges to fall down the guide tracks of the vertical arm. Likewise, a quick-access door 2, nipple section 3 with guide tracks, and a clear ball bore valve 4 attached to the lower portion of vertical arm 14 would allow a similar procedure to periodically remove empty cartridges that have accumulated in the lower portion or nipple of the vertical arm. Vacuum pumping devices would be attached to the ball valves to pump down nipple portions of the vertical arm as necessary.

Figure 4:
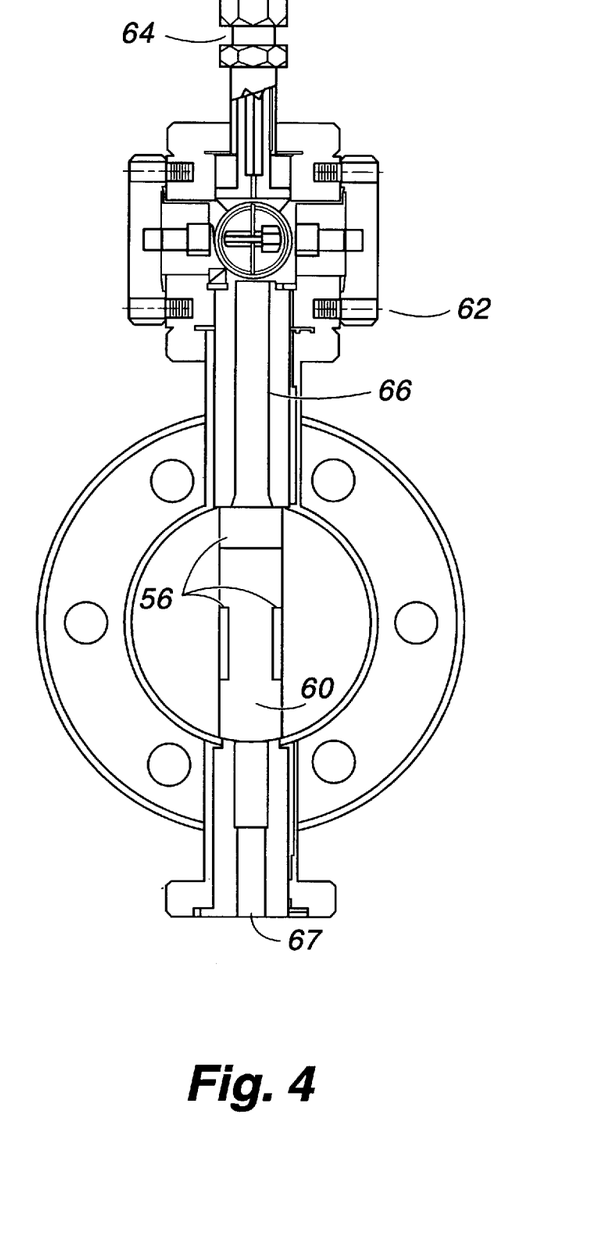
FIG. 4 shows a horizontal section through the reducing cross and shows the outline of the drop channel.
Figure 5A:
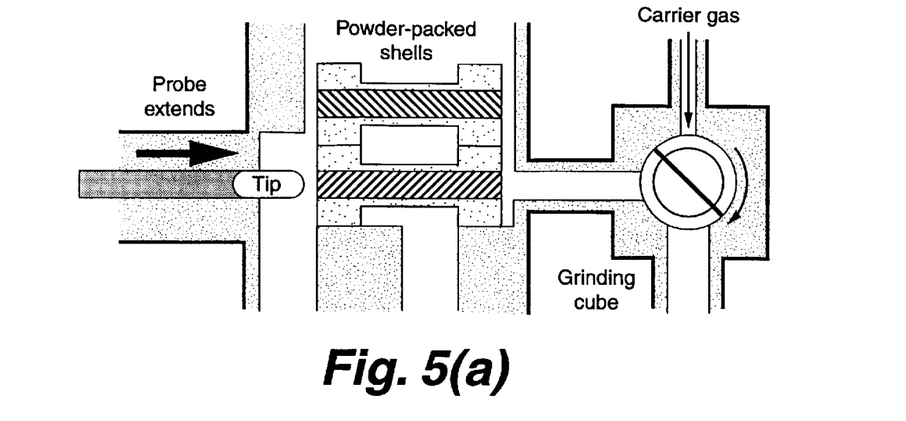
FIGS. 5(a)–5(h) are vertical sections illustrating the mechanical action of the delivery/feeder device.
Figure 5B:
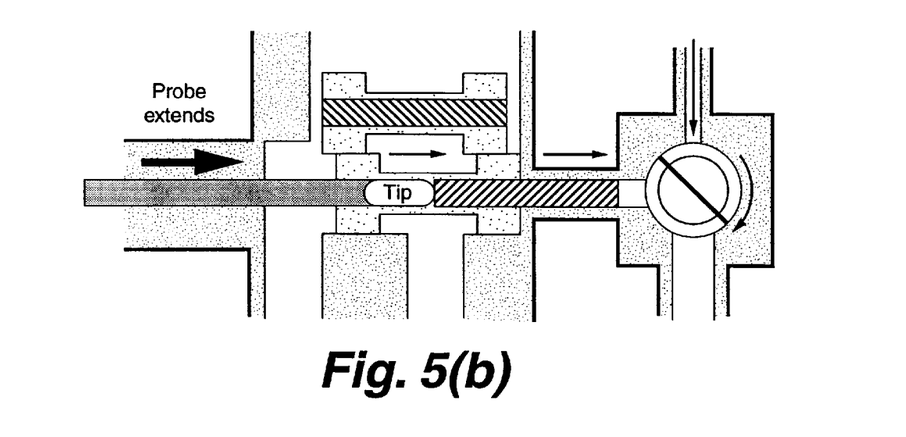
Figure 5C:
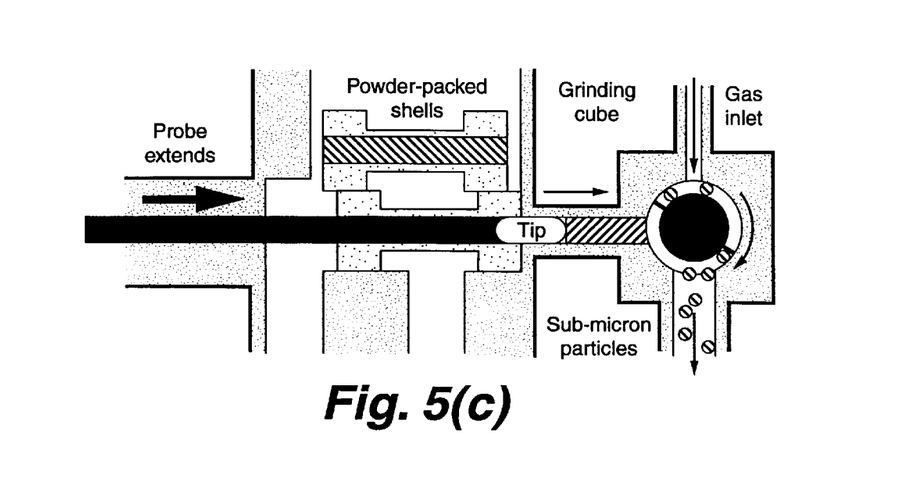
Figure 5D:
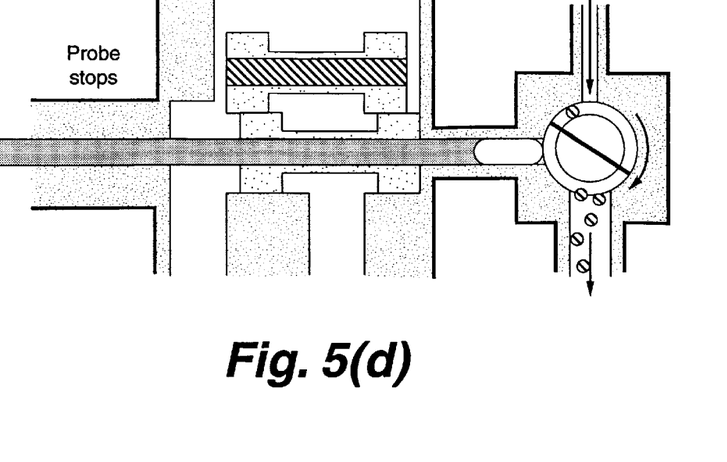
Figure 5E:
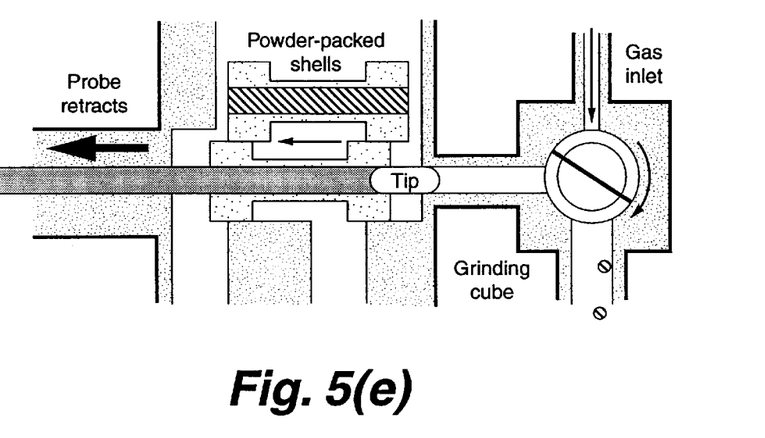
Figure 5F:
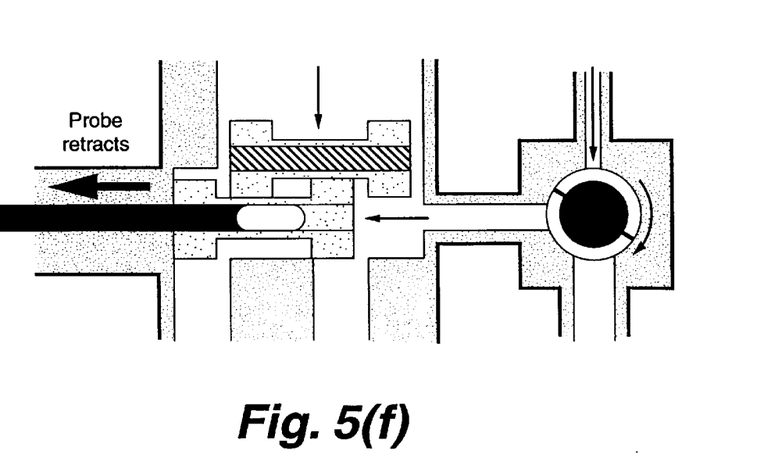
Figure 5G:
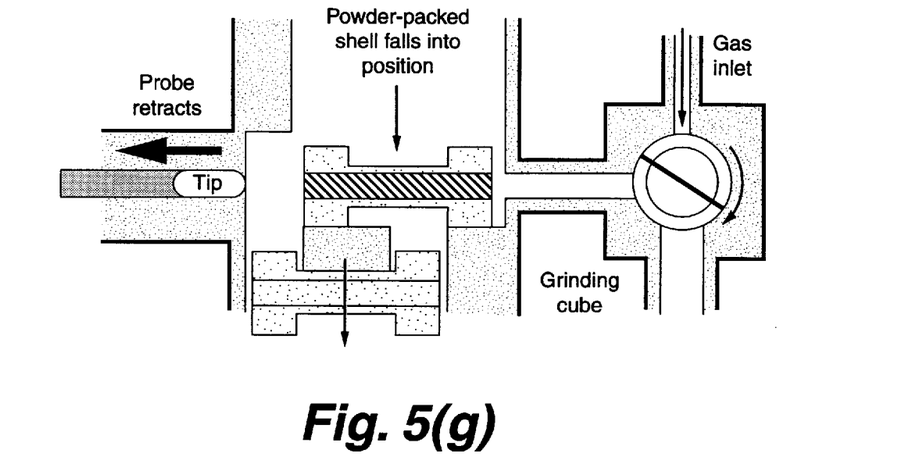
Figure 5H:
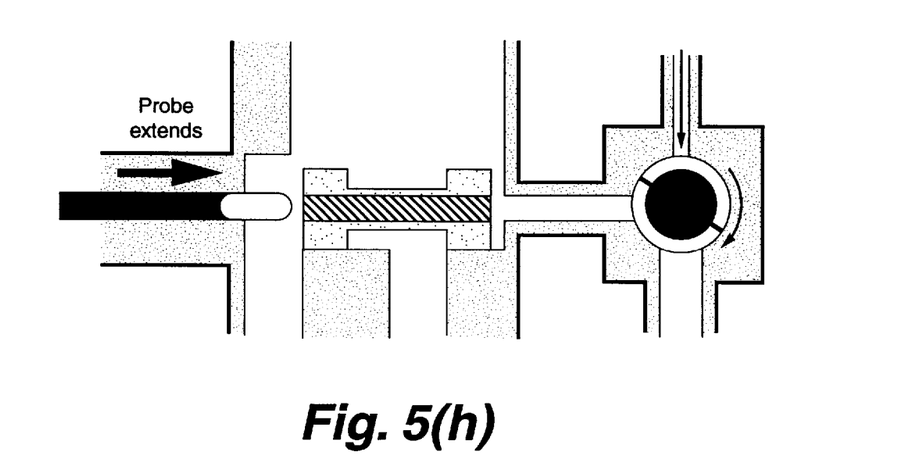

Referring to FIG. 4, a horizontal section through the reducing cross as seen from above, structure 56 provides the supporting ledge that precisely positions the bottom most packed cartridge 12 for processing. Also seen is drop channel 60 which includes lower guide tracks 54. Grinding assembly 62 is shown with carrier gas inlet 64. Also seen is probe entry tube 67 and probe exit tube 66 for precisely guiding the linear motion of linear feedthrough rod 16 situated within horizontal arm 18. Linear feedthrough rod 16 includes a Teflon®-coated tipped steel probe.

The movements of the probe and cartridges over one complete processing cycle are shown in the diagrams of FIGS. 5(a)–5(h). As the linear feedthrough extends towards the grinding mechanism, the probe is guided by a probe entry tube and ultimately pushes the precursor powder mixture out of the packed cartridge positioned at the intersection of the two arms. The probe is pushed through the cartridge and continues to move slowly through the probe exit tube until the entire amount of packed powder has been pushed into the grinder and ground into a fine (sub-micron) powder by the grinder assembly. Then the linear feedthrough pulls the probe rapidly back away from the grinder assembly. Because the Teflon®-coated tipped steel probe makes an interference fit with the inside diameter of the now empty cartridge, the cartridge is pulled by the probe tip off of the supporting ledge and is positioned over the lower guide tracks when the edge of the cartridge bumps into a stop. Although the empty cartridge is now hanging over a similarly shaped hole, it does not fall because the probe tip is still wedged within the empty core. As the motorized feedthrough continues to retreat away from the grinder assembly, the probe tip eventually exits the cartridge whereupon the empty cartridge falls down lower guide tracks into the lower portion of the vertical arm and another packed cartridge immediately drops into the bottom-most processing position.

The linear feedthrough rod 16 including the Teflon®-coated steel probe tip uses only horizontal motion to process the packed precursor powder, eject the empty cartridge and load a new packed cartridge into position. In theory, the probe can complete all of the required actions by cyclically traversing a distance that is just slightly longer than the length of the cartridge.

The cutting means can be a grinder assembly centered around a tiny steel cube attached to the end of horizontal arm 14. As the linear feedthrough rod 16 pushes the packed precursor powder from the packed cartridge into the grinder assembly, the packed powder is ground into fine, sub-micron powder particles by a pair of steel blades revolving inside the steel cube at approximately 3000 RPM. The blades are secured to the shaft of a high speed rotary motion feedthrough by two halves of a cylindrical blade holder assembly. The shaft of a brushless DC motor is attached to the feedthrough via standard flexible shaft coupler and set screws, while the body of the motor is supported by an adjustable L-bracket motor mount. Rotational speed is controlled through a potentiometer built into the body of a outboard driver box. Powder particles are blown off of the cutting blades by subsonic carrier gas entering the cube from a jet nozzle, preferably a 0.02 inch diameter jet nozzle assembly, at rates from about 1 liter per minute (l/min) to about 5 l/min. Particulates are gathered by a funneling assembly and are immediately whisked downstream by the carrier gas or gases. Space filler plugs are incorporated into the inside faces of the blank flanges attached to the steel cube. These plugs can significantly reduce the volume of the cube so that powder particles are more readily directed towards the funnel assembly and then out of the cube. If desired, additional vertical and horizontal tube assemblies can be attached to the cube in place of blank flanges. Where all the blank flanges are replaced by such assemblies, a single grinder assembly cube could process up to four different powder species, each from a separately packed cartridge, simultaneously. Mass flow for each of multiple species can be regulated independently by adjusting the linear speed of the corresponding linear motion feedthrough controllers and linear feedthrough rods.

Alternatively, the cutting means can be a tiny jet of high-velocity gas impacting upon the leading edge of the compacted precursor material.

The style and method of the cutting means is of little concern as long as two criteria are met: (1) the cutting method must be capable of dividing the compacted precursor material into very small particles at a precisely and reliably controlled rate over a long period of time; and, (2) the cutting method must sustain a rate of particulate generation that is very small, for example, less than 1 gram per hour.

The heating means can be a vaporizer. One possible embodiment of a vaporizer can be a simple device consisting of as few as six parts: ¼" ID coiled tubing, 4" diameter aluminum cylinder and supporting base, coiled heater elements, electrical wall plug, vaporizer temperature controller, and a thermocouple. Powder-laden carrier gases flow through the coiled tubing at the rate of about 1 meter per second (m/s). Within a fraction of a second, heater elements sublime the powder particles, turning them to vapor. With the optional addition of nitrogen Lewis bases to the carrier gas stream, sufficient sublimation of the Y, Ba, and Cu β-diketonates should be achieved with vaporizer temperatures no higher than 250° C.

The style and method of vaporization is of little concern as long as two criteria are met: (1) the vaporizer must be capable of completely vaporizing micron-sized precursor particulates in less than a second; and, (2) after sublimation, precursor vapors should spend no more than an additional half second residence time in the vaporizer before they are transported on and enter the deposition chamber. These time durations are approximate, but the general directive is to choose a vaporizer that inflicts as little thermal degradation on the precursor materials as possible.

If desired, a feedback control loop can be incorporated into the MOCVD system with the addition of a gas analyzer just downstream from the vaporizer. This analyzer would be sensitive to changes in precursor vapor density and stoichiometry, and could then send correction signals to one or more linear feedthrough controllers to speed up or to slow down one or more probes to control the release of more or less powder into the gas stream. An analyzer feedback control loop is presented in the overview schematic of FIG. 1.

Precursor vapors enter the deposition chamber from the bottom. Laminar flow into the chamber is preserved by a gradual increase in chamber diameter, e.g., from 14 mm to 200 mm at a 15 degree cone angle. The chamber design preferably includes geometric features that tend to thin down boundary layers and improve the uniformity of vapor pressures across the entire deposition zone near the substrate. Thus, the chamber preferably incorporates warm-wall diffusion baffling just upstream from the substrate and alignment of the substrate parallel to the flow of incoming gases.

The carrier gas generally includes inert gases such as helium and argon. The addition of nitrogen Lewis bases to the inert carrier gas or gases can allow barium β-diketonates to be transported in the vapor phase at temperatures as low as 70° C. (at 1 atm) with no decomposition. Suitable nitrogen Lewis bases can be selected from $N_2O$, $NH_3$, and $N(CH_3)_3$ Using rf coils to generate a plasma in the reacting gases may have a profound effect in improving the quality of the films. Both the oxygenation and the organometallic reactions may be enhanced during film growth. This may allow the process to proceed at lower temperatures, since energy is supplied by the rf field.

This technique has also been found useful with a variety of substrates and other films. It is important that the same ligands be used for all components of a given film to avoid ligand exchange rendering some of the components non-volatile.

The foregoing description is directed toward the growth of a single film of a given stoichiometric composition. Multilayer heterostructure films may also be grown with this apparatus by filling successive packed cartridges 12 with different mixtures of different precursor compositions, with each packed cartridge 12 having a uniform mixture of given precursor composition. As each packed cartridge 12 is processed, the corresponding film layer is grown. It will be appreciated that with the present method a great variety of multilayer heterostructure films can be grown.

The present MOCVD apparatus controls precursor mass control with a simple mechanical process, i.e., the linear motion of the probe pushing on the end of packed precursor powder within a packed cartridge. Mass flow rate is increased by increasing probe velocity, or decreased by decreasing probe velocity. Additional advantages of the present invention are obtained in the method by which the sub-micron particles become disassociated from the main body of the precursor powder pack. As the probe pushes the packed powder into the blades of a high-speed grinding rotor, sub-micron particulates of precursor material are scraped off the end of the packed precursor powder. These particles are later vaporized by suitable heating and thermal processing is not relied upon for initial separation from the packed powder. Particle size can be altered by varying the grinder rotor speed. Generally, as smaller particles are preferred, the rotor speed is maintained at the highest available speed. As the velocity of the probe or probes determines precursor flow rate, the present apparatus uses one set of control variables, i.e., probe velocity or velocities, to regulate composition and precursor delivery rate independently.

Although the present invention has been described with reference to specific details, it is not intended that such details should be regarded as limitations upon the scope of the invention, except as and to the extent that they are included in the accompanying claims.

What is claimed is:

1. An apparatus for metalorganic chemical vapor deposition of thin films onto a substrate, said apparatus comprising:
   a delivery means for feeding a solid including at least one precursor material into a cutting means for generating small diameter particles of said solid;
   a vaporizing means for raising the temperature of said small diameter particles above their vaporization temperatures whereby vapors of said small diameter particles are generated;
   a reaction zone wherein said vapors of said small diameter particles undergo chemical reaction and deposit on a substrate within said reaction zone; and,
   a transport means for transporting said small diameter particles from said cutting means to said vaporizing means and for transporting said vapors of said small diameter particles from said vaporizing means to said reaction zone.

2. The apparatus of claim 1 further comprising an analyzing means for measuring vapor density and composition of said vapors generated by said vaporizing means, said analyzing means linked to said delivery means as a feedback control on the rate of delivery of solid including at least one precursor material into said cutting means.

3. The apparatus of claim 1 wherein said transport means comprises a carrier gas and a means for propelling said carrier gas, such that said carrier gas is transported from said cutting means together with said small diameter particles to said vaporizing means, and said carrier gas is transported from said vaporizing means together with said vapors of said small diameter particles to said reaction zone.

4. The apparatus of claim 3 further comprising a means for introducing reaction gases into said carrier gas at a controlled rate, said reaction gases selected from the group consisting of $O_2$, $N_2O$, $NH_3$, $N(CH_3)_3$ and combinations thereof.

5. The apparatus of claim 4 further comprising a plasma means for producing a plasma within said reaction zone whereat said carrier gas containing said reaction gases and said vapors of said small diameter particles have been introduced.

6. The apparatus of claim 1 further comprising a loading means for introducing said solid of at least one precursor material into a storage compartment without the introduction of foreign gases into said apparatus.

7. The apparatus of claim 1 wherein said solid of at least one precursor material is contained within a protective cartridge.

8. The apparatus of claim 7 further comprising a disposal means for removing and storing said protective cartridge without the introduction of foreign gases into said apparatus.

9. The apparatus of claim 7 wherein said protective cartridge comprises an indented central portion, protruding end portions and an aperture.

10. The apparatus of claim 9 wherein said delivery means includes a probe tip making an interference fit with said aperture of said protective cartridge.

11. The apparatus of claim 1 wherein said cutting means comprises a rotary scrapping and grinding means for generating small diameter particles of said solid.

12. The apparatus of claim 1 wherein said cutting means comprises a jet of gas impacting said solid for generating small diameter particles of said solid.

13. The apparatus of claim 3 further comprising a second delivery means for feeding a second solid including at least one precursor material into a cutting means for generating small diameter particles of said solid, said apparatus characterized in that each delivery means of the apparatus separately controls mass flow for a solid fed by that delivery means.

14. The apparatus of claim 1 wherein said vapors are exposed to temperatures at or above the vaporization temperatures of the precursor materials for a substantially short period of time prior to said vapors passing to the reaction zone.

15. The apparatus of claim 1 wherein said vapors are transported from said vaporizing means to said reaction zone by a transport line of substantially minimal length.

16. The apparatus of claim 1 further comprising a plasma means for producing a plasma in said vapors in said reaction zone.

17. The apparatus of claim 1 further comprising a heating means for controlling the temperature of said substrate.

18. The apparatus of claim 1 wherein said vapors pass through a diffusion baffeling prior to said vapors entering said reaction zone.

19. The apparatus of claim 1 further comprising a substrate delivery means for exposing a substrate of substantially long length to said vapors within said reaction zone.

20. The apparatus of claim 1 wherein said substrate is oriented within said reaction zone such that a longest face of said substrate is aligned substantially parallel to vapor flow in said reaction zone.

21. The apparatus of claim 1 further characterized as having said vaporizing means substantially thermally isolated from said delivery means and cutting means whereby said small diameter particles are maintained beneath their vaporization temperatures until said vaporizing means.

* * * * *